(12) United States Patent
Chen et al.

(10) Patent No.: US 9,129,070 B2
(45) Date of Patent: Sep. 8, 2015

(54) PORTABLE MEMORY STORAGE DEVICE (71) Applicants: LITE-ON ELECTRONICS (GUANGZHOU) LIMITED, Guangzhou (CN); LITE-ON TECHNOLOGY CORP., Taipei (TW)

(72) Inventors: Sheng-Kao Chen, Taipei (TW); Ching-Hui Chen, Taipei (TW); Hung-Chih Wang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 377 days.

(21) Appl. No.: 13/790,725

(22) Filed: Mar. 8, 2013

(65) Prior Publication Data

US 2013/0326103 A1 Dec. 5, 2013

(30) Foreign Application Priority Data

Jun. 4, 2012 (CN) .................... 2012 2 0259566 U (51) Int. Cl.
*H05K 5/02* (2006.01)
*G06F 13/40* (2006.01)

(52) U.S. Cl.
CPC .......... G06F 13/4081 (2013.01); *H05K 5/0256* (2013.01)

(58) Field of Classification Search
CPC .............. H05K 5/0256; H05K 5/0278; G06K 19/07732; G06F 13/409; G06F 13/4081; G06F 13/4068

USPC ................................................... 710/301–302
See application file for complete search history.

(56) References Cited

U.S. PATENT DOCUMENTS

| | | | |
|---|---|---|---|
| 7,524,198 B2* | 4/2009 | Nguyen et al. ................ 439/131 |
| 7,535,719 B2* | 5/2009 | Hiew et al. .................... 361/737 |
| 7,751,183 B2* | 7/2010 | Harris ...................... 361/679.41 |
| 7,878,852 B2* | 2/2011 | Hiew et al. ................ 439/607.01 |
| 7,944,702 B2* | 5/2011 | Ni et al. ........................ 361/737 |
| 7,959,448 B1* | 6/2011 | Chou et al. .................... 439/131 |
| 8,102,662 B2* | 1/2012 | Hiew et al. .................... 361/752 |
| 8,360,809 B2* | 1/2013 | Chou et al. ................ 439/620.21 |
| 8,681,490 B2* | 3/2014 | Chen et al. ................ 361/679.39 |
| 2006/0082963 A1* | 4/2006 | Chen ............................ 361/684 |
| 2007/0165457 A1* | 7/2007 | Kim ......................... 365/185.11 |
| 2011/0029721 A1* | 2/2011 | Yu et al. ........................ 711/103 |
| 2014/0340835 A1* | 11/2014 | Wang ....................... 361/679.32 |

* cited by examiner

Primary Examiner — Brian Misiura
(74) Attorney, Agent, or Firm — Rosenberg, Klein & Lee (57) ABSTRACT A portable memory storage device includes a housing and plural memory modules insertable into the housing. Each memory module includes a module shell, which has a module body and a positioning mechanism, and a memory member connected to the module shell. The positioning mechanism is disposed on the module body and is exposed from the housing. The positioning mechanism of a first memory module abuts against a front opening-defining edge, and the positioning mechanism of a last memory module abuts against a rear opening-defining edge, such that the plural memory modules are positioned in the housing. The memory module may be removed from the housing when the positioning mechanism is depressed.

12 Claims, 11 Drawing Sheets

PORTABLE MEMORY STORAGE DEVICE

CROSS-REFERENCE TO RELATED APPLICATION

This application claims priority of Chinese Application No. 201220259566.2, filed on Jun. 4, 2012.

BACKGROUND OF THE INVENTION

1. Field of the Invention

The invention relates to a memory storage device, and more particularly to a portable memory storage device that may facilitate locating and accessing files stored therein.

2. Description of the Related Art

Following the trends of technological advances, a conventional portable memory storage device, commonly known as a flash drive, offers increased storage capacity without increasing physical dimensions. The small size and great storage capacity of the conventional portable memory storage device makes itself suitable for storing and transporting vast amounts of information and data.

However, because the conventional portable memory storage device may store a greater number of electronic files in various formats, such as video, music, image, etc., there is an inherent inconvenience in locating specific electronic files stored in the high-capacity portable memory storage device.

SUMMARY OF THE INVENTION

Therefore, the object of the present invention is to provide a portable memory storage device that may alleviate the above drawbacks of the prior art.

Accordingly, a portable memory storage device of the present invention is adapted to be inserted into a port connector of an electronic device, and comprises a housing and a plurality of memory modules.

The housing defines a receptive space therein, extends in an extension direction, and includes a front end portion being formed with a front slot in spatial communication with the receptive space, a rear end portion opposite to the front end portion in the extension direction and being formed with a rear slot in spatial communication with the receptive space, and a top plate extending from the front end portion to the rear end portion and being formed with a window opening that extends in the extension direction and that is in spatial communication with the receptive space.

The memory modules are insertable into the housing in the extension direction through one of the front slot and the rear slot. Each of the memory modules includes a module shell, which includes a module body and a positioning mechanism disposed at the module body, and a memory member connected to the module shell. The module body includes a substrate that has an inner surface defining a first accommodating space and an outer surface. The positioning mechanism is disposed on the substrate and includes a resilient member that is shiftable between a default state, where the resilient member protrudes from the outer surface of the substrate, and a depressed state, where the resilient member sinks into the substrate toward the inner surface of the substrate. The memory member includes an insulating case having a main portion that is disposed in the first accommodating space and a tongue portion that is exposed from the module shell, a plurality of pins disposed on the tongue portion and spaced apart from one another, and a memory unit disposed within the insulating case and electrically connected to the pins.

A first one of the memory modules is disposed in the receptive space of the housing and is closely adjacent to the front slot of the front end portion. The front end portion of the housing surrounds the tongue portion of the insulating case of the first one of the memory modules to constitute a plug portion that is configured to be inserted into the port connector of the electronic device, and the pins of the first one of the memory modules are configured to be electrically connected to the port connector.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
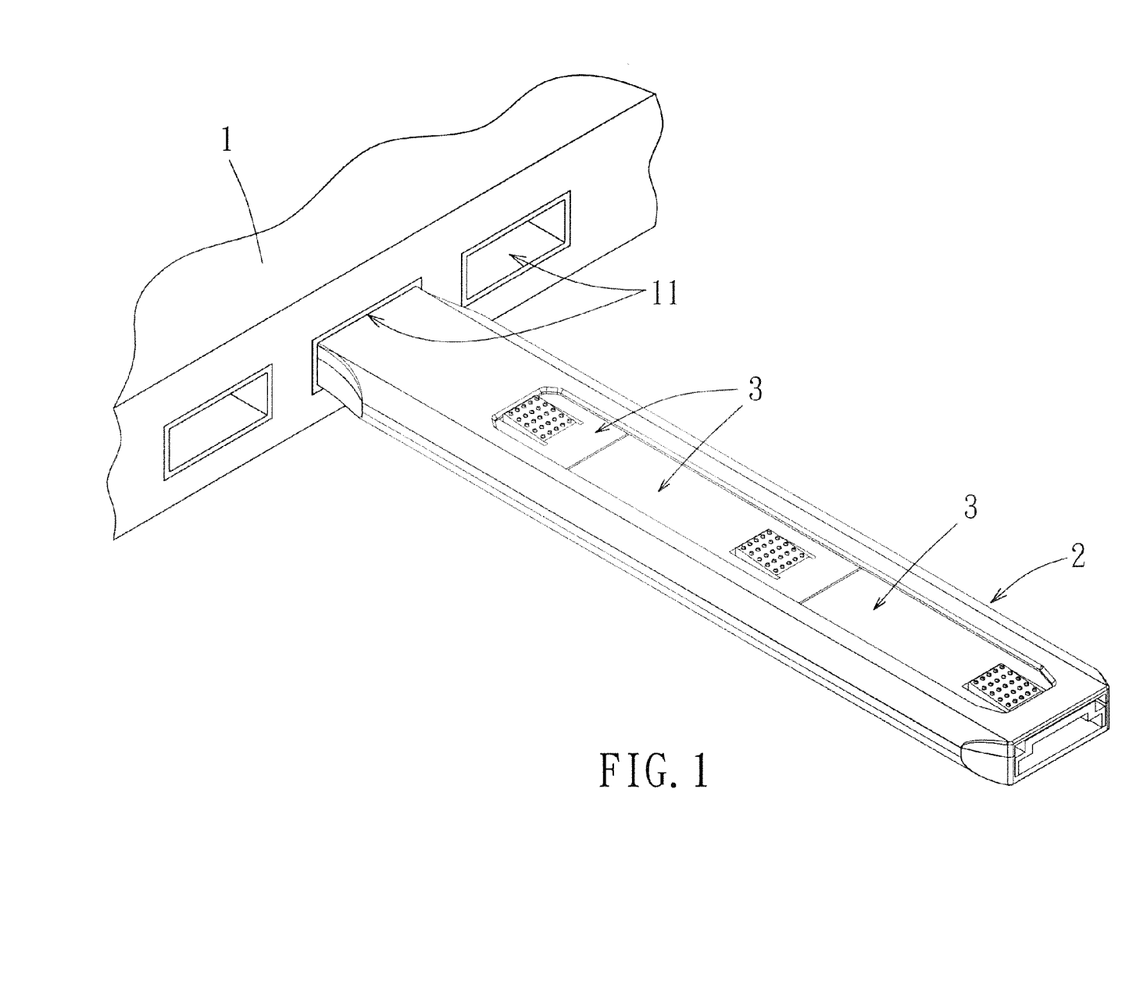
FIG. 1 is a perspective view of the preferred embodiment of the portable memory storage device of this invention coupled to an electronic device.

With reference to FIG. 1, the preferred embodiment of a portable memory storage device of the present invention is adapted to be inserted into a port connector 11 of an electronic device 1, and includes a housing 2 and three memory modules 3. It should be appreciated that the number of the memory modules 3 may vary and is not limited to the disclosure of this embodiment.

With reference to FIGS. 2 to 5, the housing 2 is a hollow shell, extends in an extension direction (A), and defines a receptive space 23 for accommodating the memory modules 3. The housing 2 includes a front end portion 21, a rear end portion 22 opposite to the front end portion 21 in the extension direction (A), a top plate 24 extending between the front end portion 21 and the rear end portion 22, a bottom plate 26 opposite to the top plate 24, and two side walls 25 extending in the extension direction (A) and being connected between the top plate 24 and the bottom plate 26 at opposite longitudinal sides of the housing 2 parallel to the extension direction (A). The front end portion 21 is formed with a front slot 27, and the rear end portion 22 is formed with a rear slot 28. The front slot 27 and the rear slot 28 are both in spatial communication with the receptive space 23 such that memory modules 3 may access the receptive space 23 through the front slot 27 and the rear slot 28. The top plate 24 is formed with a window opening 243 extending in the extension direction (A) and in spatial communication with the receptive space 23, and has front and rear opening-defining edges 241 and 242 that are opposite to each other in the extension direction (A), that define the window opening 243 therebetween, and that are adjacent to the front and rear end portions 21 and 22, respectively. The top plate 24, the bottom plate 26 and the side walls 25 cooperate to constitute a plug portion 29, which is adapted to be inserted into the port connector 11 of the electronic device 1, at the front end portion 21. A thickness of a portion of each of the side walls 25 at the plug portion 29 is less than a thickness of a remaining portion of each of the side walls 25. Namely, the side walls 25 of the housing 2 have a relatively greater thickness at the remaining portion for fortifying the housing 2 and protecting the memory modules 3 therein.

The memory modules 3 abut against and are aligned with one another in the receptive space 23 of the housing 2 in the extension direction (A), are not electrically connected to one another, and are insertable into or out of the receptive space 23 of the housing 3 in the extension direction (A) through the front slot 27 and the rear slot 28. In this embodiment, each of the memory modules 3 is chip-on-board assembly, and includes a module shell 31 and a memory member 34 connected thereto.

Figure 6:
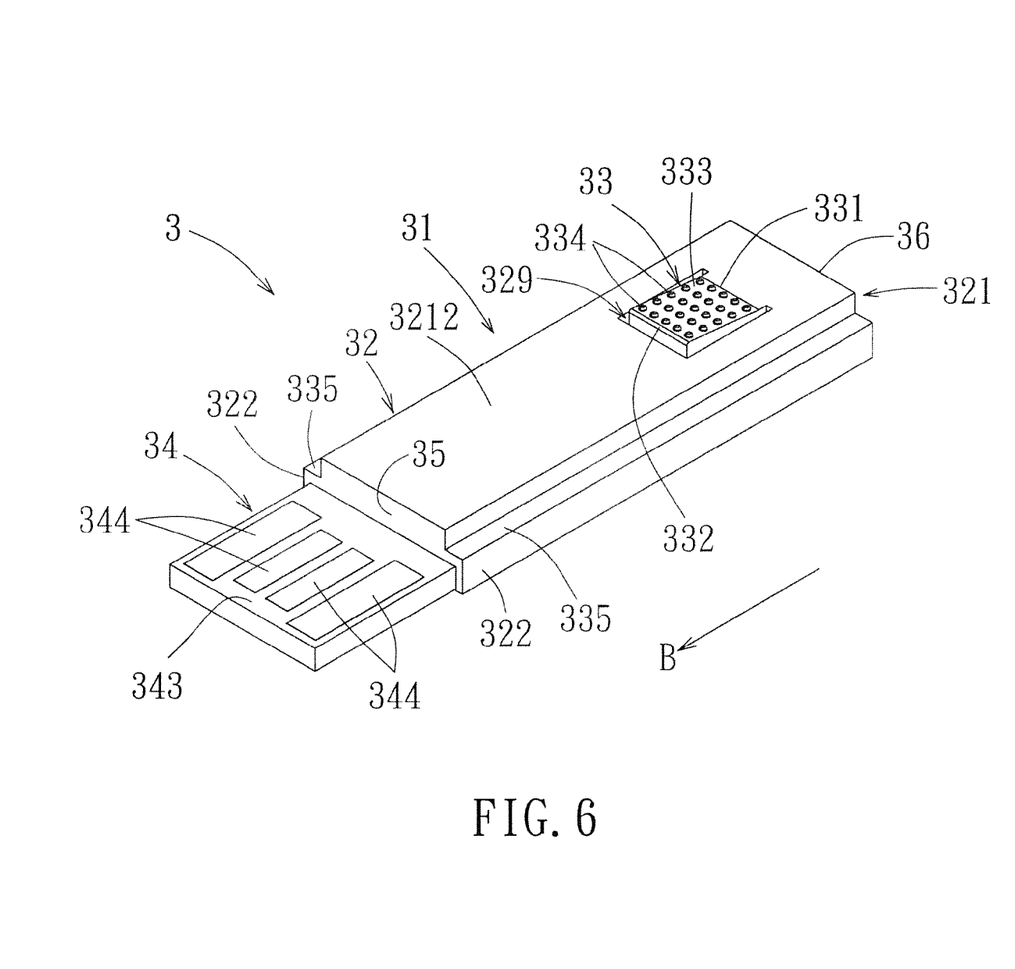
FIG. 6 is an enlarged perspective view of a memory module of the portable memory storage device.
Figure 7:
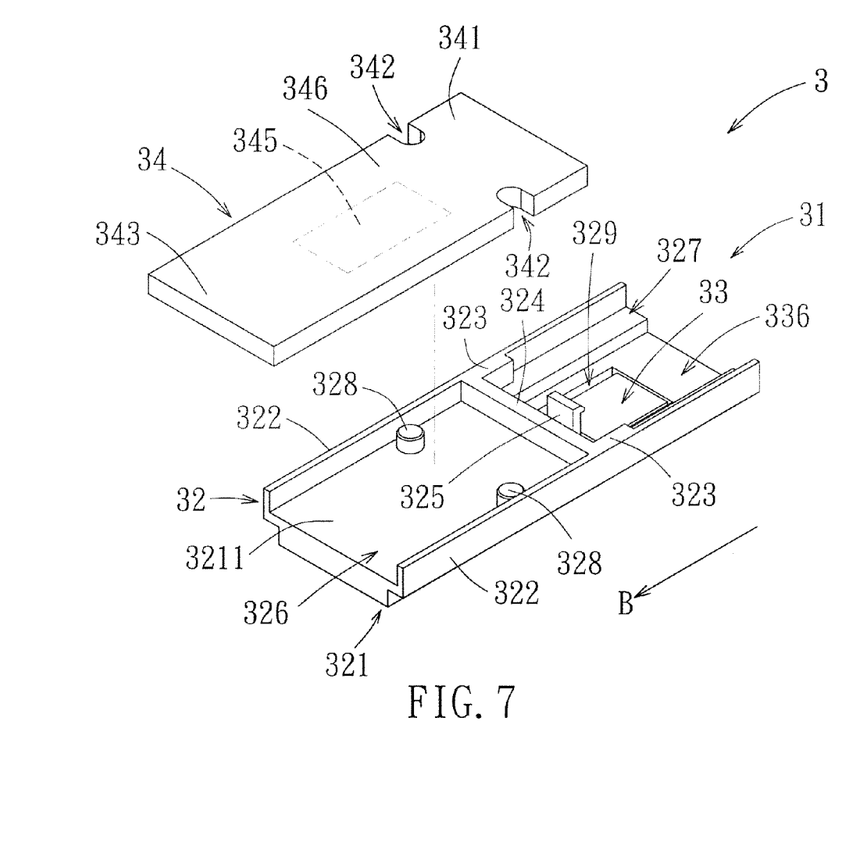
FIG. 7 is an enlarged exploded perspective view of the memory module.

With reference to FIGS. 6 and 7, the module shell 31 includes a module body 32 and a positioning mechanism 33 disposed on the module body 32. The module body 32 includes a substrate 321 extending in a longitudinal direction (B) and having an inner surface 3211 and an outer surface 3212, a pair of lateral walls 322 protruding respectively from opposite sides of the substrate 321 toward the inner surface 3211 and extending in the longitudinal direction (B), a partition wall 324 perpendicular to the longitudinal direction (B) and connected between the lateral walls 322, and a retaining wall 325 spaced apart from the partition wall 324 and protruding from the inner surface 3211 of the substrate 321. The substrate 321, the lateral walls 322, and the partition wall 324 cooperate to define a first accommodating space 326. The module body 32 further includes a pair of pegs 328 that are spaced apart from each other and that protrude from the inner surface 3211 of the substrate 321 in the first accommodating pace 326. The substrate 321, the lateral walls 322, and the retaining wall 325 cooperate to define a second accommodating space 327 opposite to the first accommodating space 326 in the longitudinal direction (B). Namely, the first and second accommodating spaces 326, 327 are arranged in the longitudinal direction (B), and covered by the substrate 321. The substrate 321 and respective front segments of the lateral walls 322 in front of the partition wall 324 define the first accommodating space 326, and the substrate 321 and respective rear segments of the lateral walls 322 behind the partition wall 324 define the second accommodating space 327. Each of the lateral walls 322 has an abutment portion 323 adjacent to the partition wall 324 and extending toward the retaining wall 325.

Figure 12:
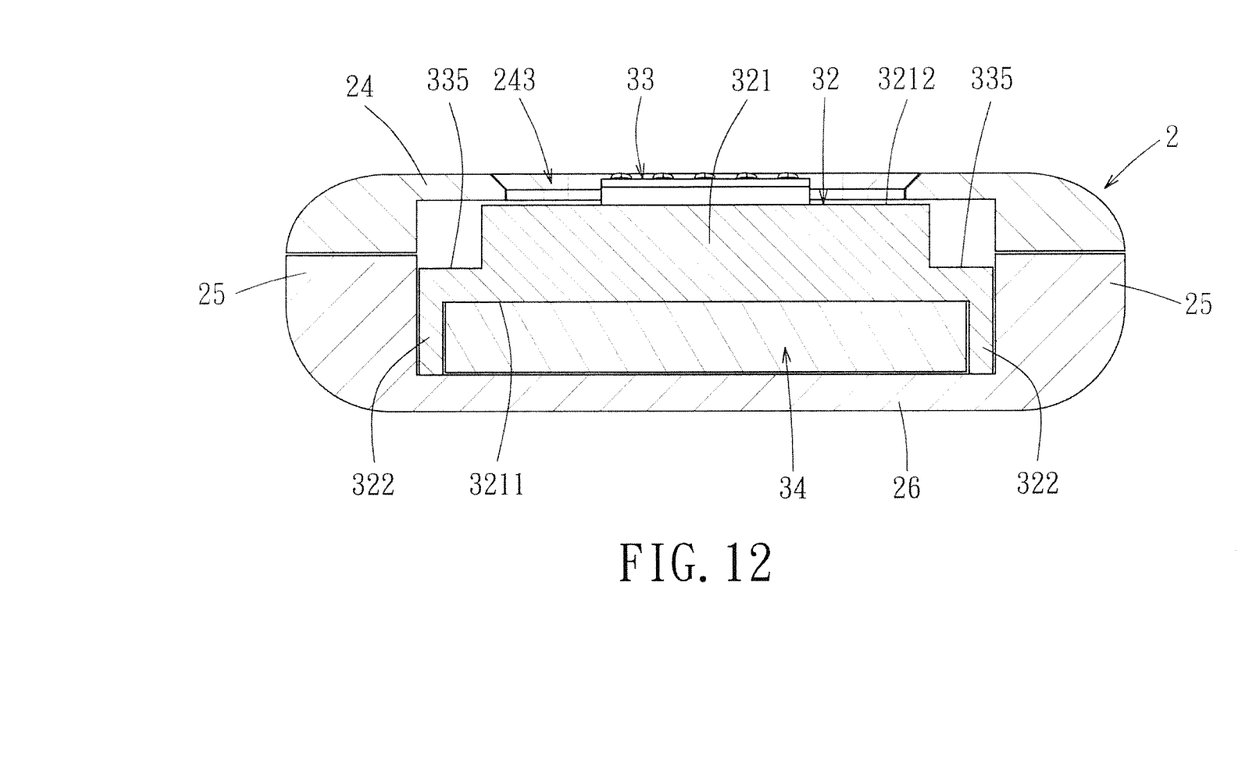
FIG. 12 is an enlarged cross-sectional view of the portable memory storage device of FIG. 1, taken along line XII-XII in FIG. 2.

With reference to FIGS. 6 and 12, each of the lateral walls 322 is depressed to form a shoulder portion 335 on a connection edge with the substrate 321. The shoulder portions 335 are spaced apart from the top plate 24 of the housing 2 when the memory module 3 is disposed in the housing 3, reducing friction force between the module body 32 and the housing 2 when the memory module 3 slides within the housing 2.

Figure 2:
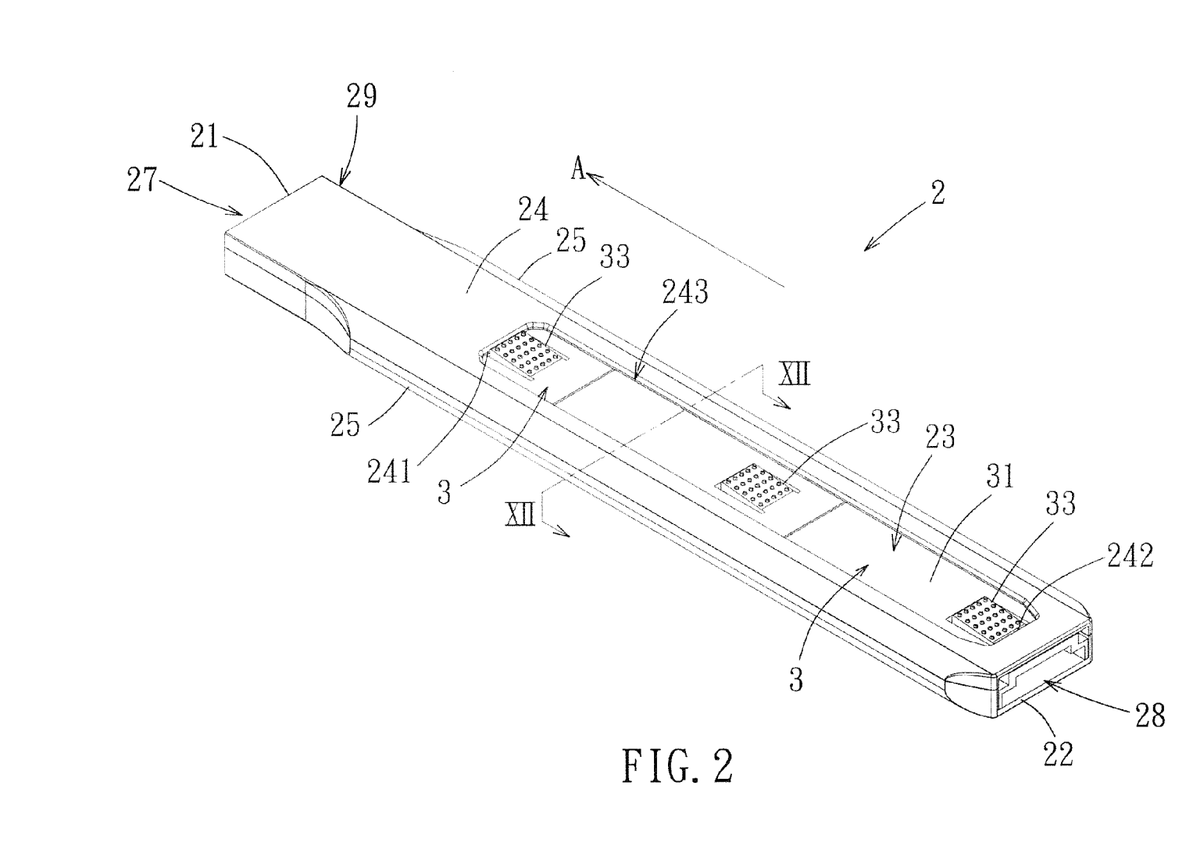
FIG. 2 is a perspective view of the portable memory storage device of FIG. 1.
Figure 3:
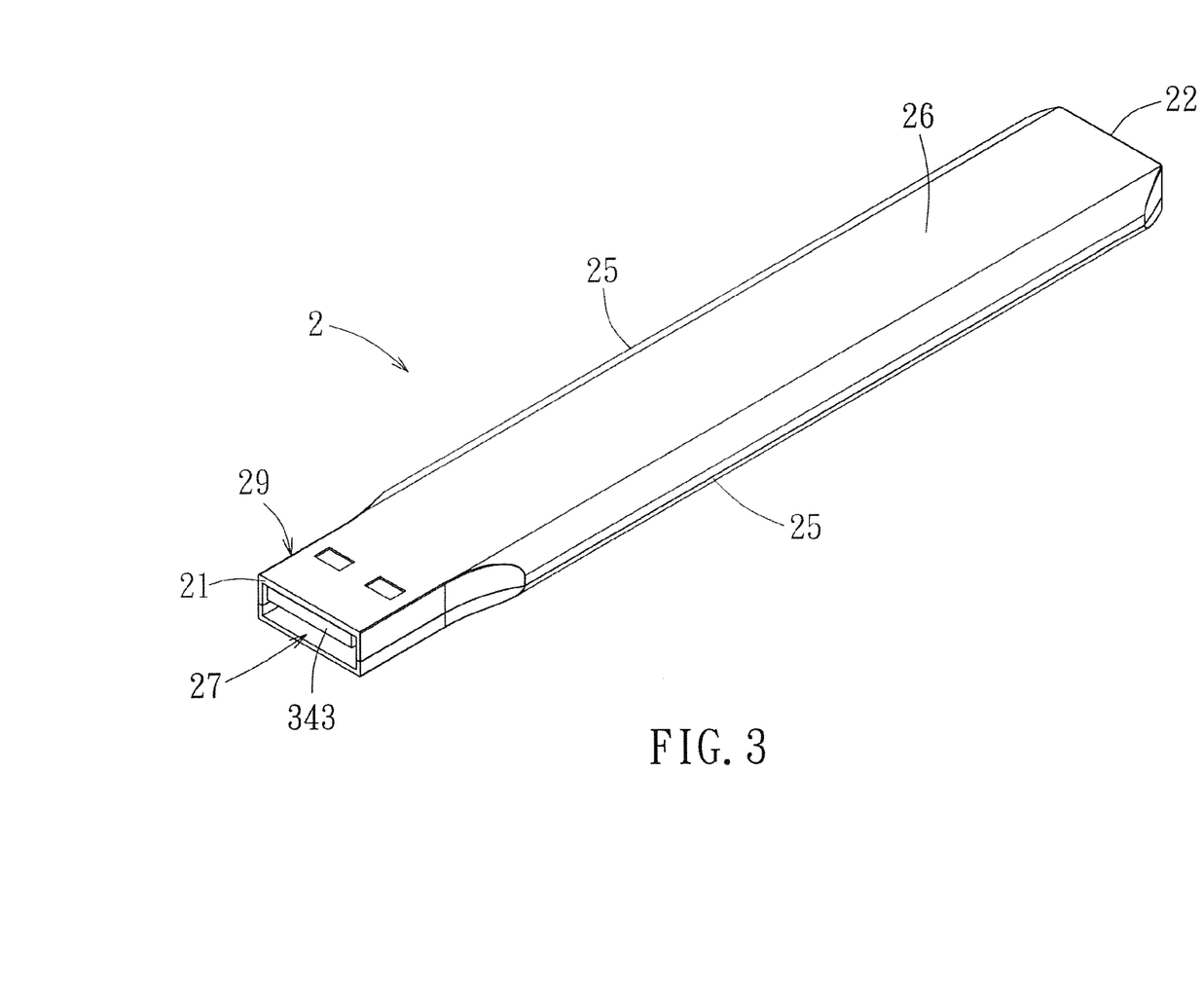
FIG. 3 is a perspective view of the portable memory storage device of FIG. 1 from a different viewing angle.
Figure 10:
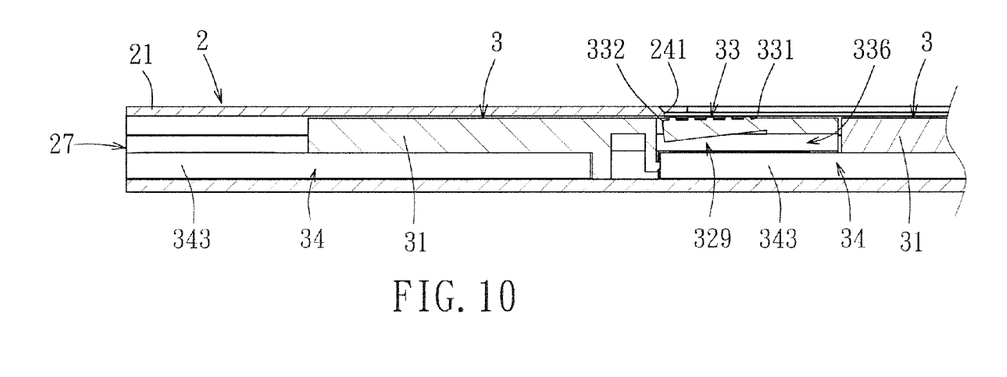
FIGS. 10 and 11 are enlarged fragmentary cross-sectional side views of the portable memory storage device of FIG. 1, illustrating movement of the memory modules.

With reference to FIGS. 2, 6 and 7, the positioning mechanism 33 in this embodiment is integrally connected to the substrate 321, and includes a connecting portion 331 attached to the substrate 321 and a resilient member 332 extending inclinedly and upwardly from the connecting portion 331 in the longitudinal direction (BF) toward a front side 35 of the module body 32. The resilient member 332 is a resilient tab, and has an outer surface 333 exposed from the outer surface 3212 of the substrate 321 and having a plurality of spaced-apart protuberances 334 thereon. For example, each of the protuberances 334 is in a semicircular shape. The resilient member 332 is shiftable between a default state, where the resilient member 332 protrudes from the outer surface 3212 of the substrate 321 (see FIGS. 4 and 6), and a depressed state, where the resilient member 332 sinks into the substrate 321 (see FIGS. 10 and 11) toward the inner surface 3211 of the substrate 321. The substrate 321 is formed with a substrate opening 329, in which the positioning mechanism 33 is disposed, and an allowance space 336 (see FIG. 4) adjacent to the second accommodating space 327 and in spatial communication with the substrate opening 329 for accommodating the resilient member 332 in the depressed state (see FIG. 10).

Specifically, the resilient member 332 is wedge-shaped with a thickness increased from one end at the connecting portion 331 to the other end toward the front side 35 of the module body 32. The exposed outer surface 333 faces the window opening 243 of the top plate 24 of the housing 2 when the memory module 3 is received in the receptive space 23 of the housing 2. When a user intends to shift the memory module 3 within the housing 2, the protuberances 334 on the outer surface 333 of the resilient member 332 may increase friction between the outer surface 333 and the user's finger to facilitate shifting the memory module 3 within the housing 2.

With reference to FIGS. 6 and 7, the memory member 34 is connected to the module shell 31, and includes an insulating case 341, a plurality of pins 344, and a memory unit 345 disposed in the insulating case 341. The insulating case 341 is formed with two spaced-apart notches 342 corresponding to and engaging the pegs 328 in the first accommodating space 326 on the module body 32, respectively. The insulating case 341 is connected to the module shell 31, and has a main portion 346 that is disposed in the first accommodating space 326 and a tongue portion 343 that is exposed from the module shell 31. The pins 344 are disposed on the tongue portion 343 and are spaced apart from one another. The memory unit 345 is disposed within the insulating case 34 and is electrically connected to the pins 344. In this embodiment, the memory member 34 is similar to a memory card used in the electronic device 1, such as a digital camera, a laptop computer, and so forth.

With reference to FIG. 2 and FIGS. 4 to 7, when being disposed in the housing 2, the memory modules 3 abut against and are aligned with one another in the receptive space 23 of the housing 2. In particular, the tongue portion 343 of a first one of the memory modules 3, which is closely adjacent to the front slot 27 of the front end portion 21, is closely adjacent to the front slot 24, and is surrounded by the plug portion 29 of the top plate 24, the bottom plate 26 and the side walls 25. Since the resilient member 332, in the default state, is exposed from the outer surface 3212 of the substrate 321, the resilient member 332 of the first one of the memory modules 3 engages and abuts against the front opening-defining edge 241 of the top plate 24 of the housing 2, and the resilient member 332 of a last one of the memory modules 3, which is closely adjacent to the rear end portion 22, engages and abuts against the rear opening-defining edge 242 of the top plate 24, such that the memory modules 3 are positioned in the receptive space 23 of the housing 2. Further, the lateral walls 322 of each memory module 3 abut against the side walls 25 of the housing 2, respectively, restricting lateral movement of the memory modules 3 in a direction perpendicular to the extension direction (A) within the housing 2. In addition, the tongue portion 343 of each remaining one of the memory modules 3, excluding the first one, is received in the second accommodating space 324 of a preceding one of the memory modules 3 that is immediately in front of the remaining one of the memory modules 3. In particular, the tongue portion 343 of the remaining one of the memory modules 3 abuts against the abutment portion 323 and the retaining wall 325 of the preceding one of the memory modules 3, and the front side 35 of the module body 32 of the remaining one of the memory modules 3 abuts against a rear side 36 of the module body 32 of the preceding one of the memory modules 3.

Figure 4:
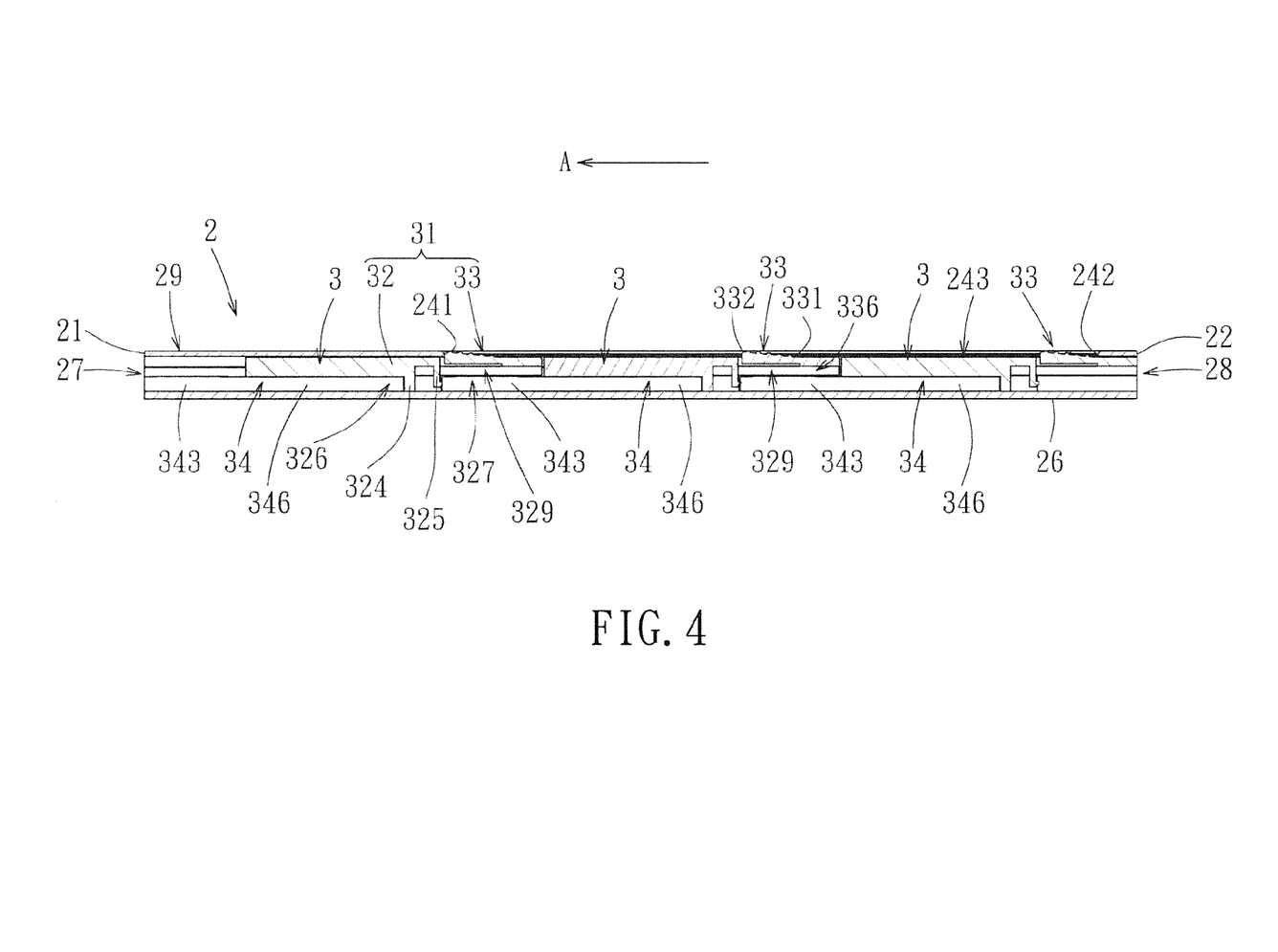
FIG. 4 is a cross-sectional side view of the portable memory storage device of FIG. 1.
Figure 5:
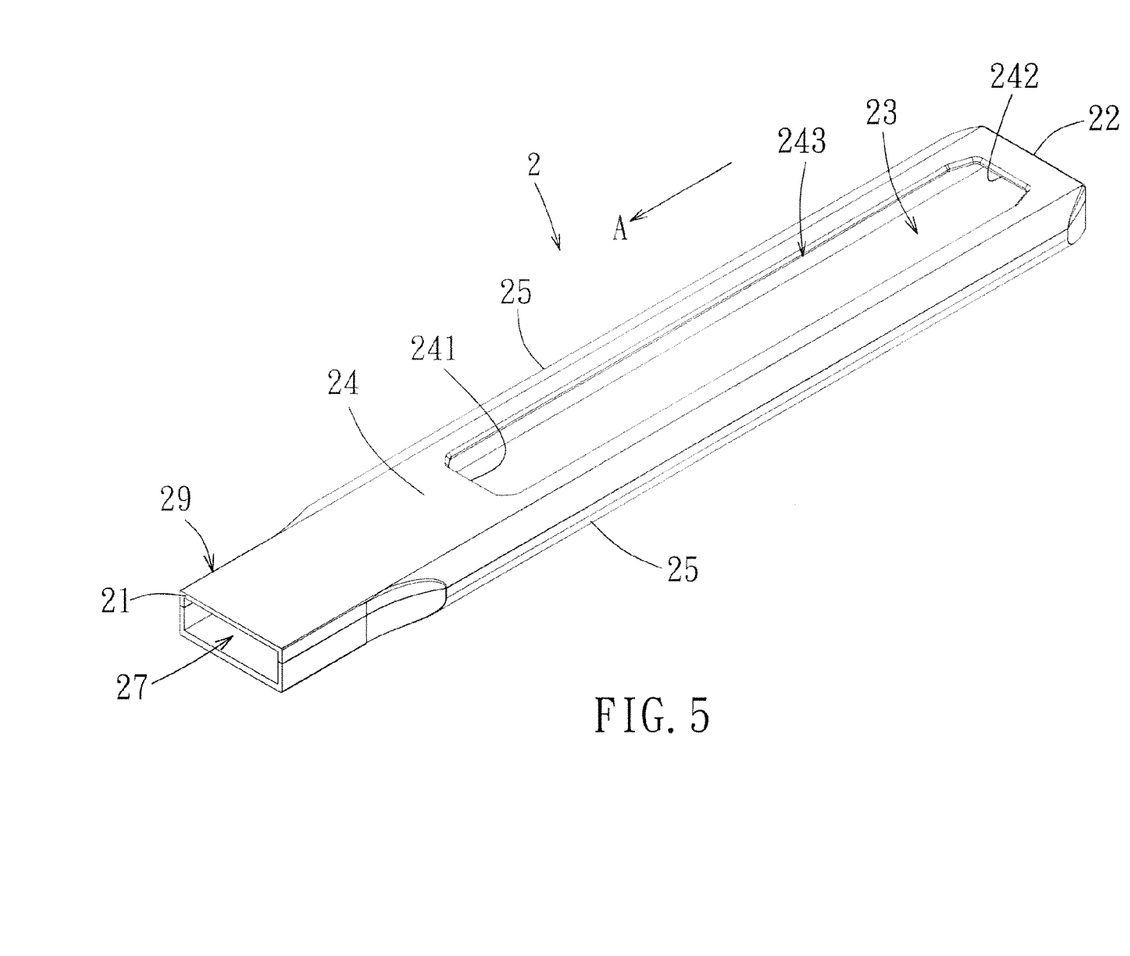
FIG. 5 is a perspective view of a housing of the portable memory storage device.

With reference to FIGS. 1, 2 and 4, the plug portion 29 of the housing 2 at the front end portion 21 surrounds the tongue portion 343, and is configured to be inserted into the port connector 11 of the electronic device 1. As the plug portion 29 is inserted, the pins 344 on the tongue portion 343 electrically contact terminals (not shown) of the port connector 11, thereby creating a counterforce pushing the memory module 3 back toward the rear end portion 22 of the housing 2. However, because the counterforce is insufficient to disengage the positioning mechanism 33 of the last memory module 3 at the rear end portion 22 from the rear opening-defining edge 242, the first memory module 3 at the front end portion 21 can counteract the counterforce. Thus, the counterforce cannot push the first memory module 3 into the housing 2, and the pins 344 of the first memory module 3 are able to be electrically connected to the port connector 11, thereby allowing the memory module 3 and the electronic device 1 to exchange information.

Figure 8:
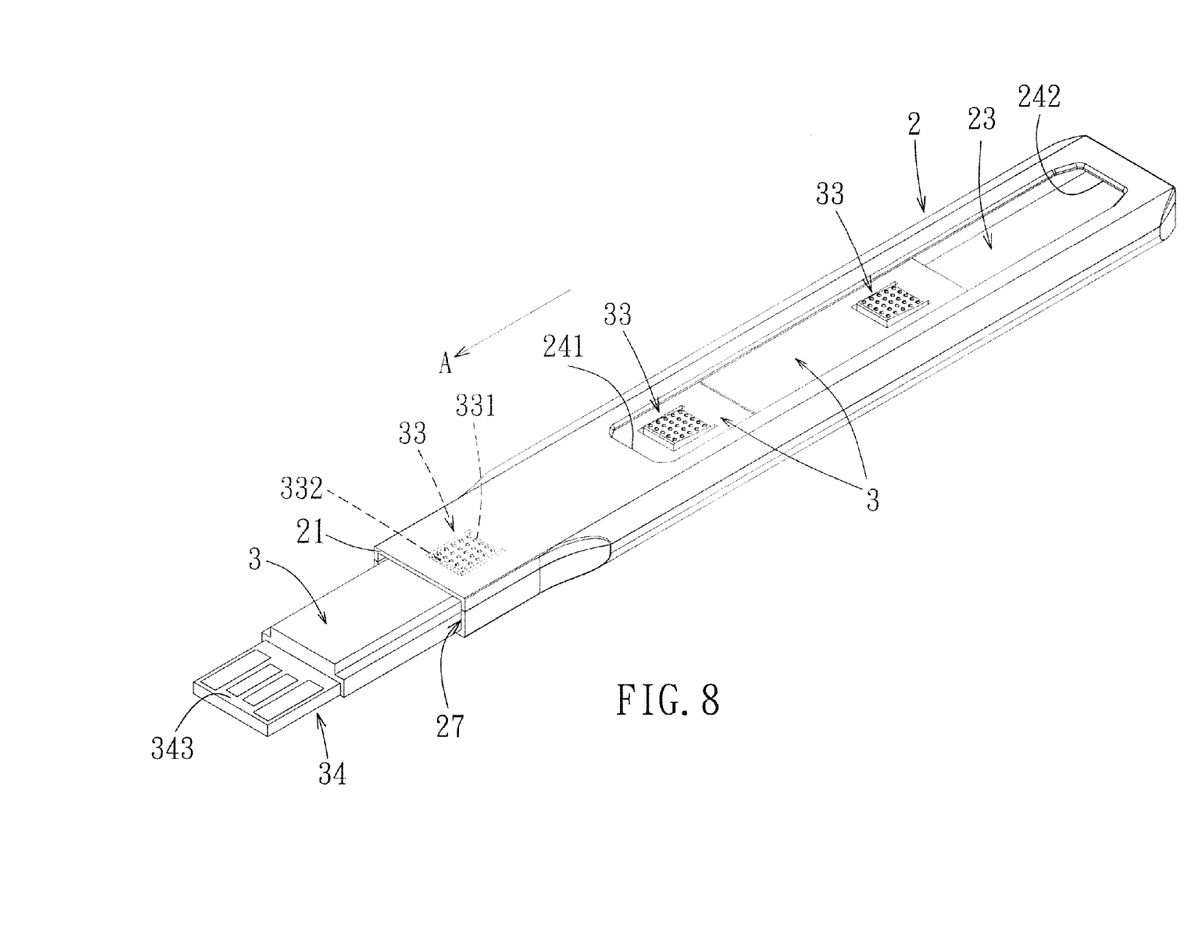
FIG. 8 is a perspective view of the portable memory storage device of FIG. 1, illustrating extraction of the memory modules.
Figure 11:
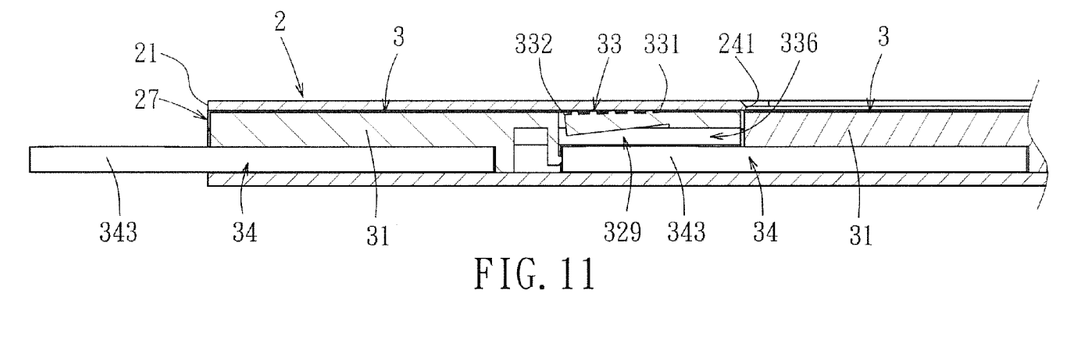

With reference to FIGS. 8 to 11, when a user desires to access and connect another one of the memory modules 3, but not the first memory module 3, with the port connector 11, the user may press the resilient member 332 of the first memory module 3 to the depressed state through the substrate opening 329 into the allowance space 336. As a result, the resilient member 332 is below and disengaged from the front opening-defining edge 241, and the memory modules 3 are slidable in the extension direction (A). Then, as shown in FIGS. 8 and 11, the first memory module 3 is pushed toward the front end portion 21 in the extension direction (A) so that the positioning mechanism 33 slides under the front opening-defining edge 241. Therefore, the first memory module 3 is exposed from the housing 2 through the front slot 27 as shown in FIGS. 8 and 11, and the user may extract it out of the housing 2.

Figure 9:
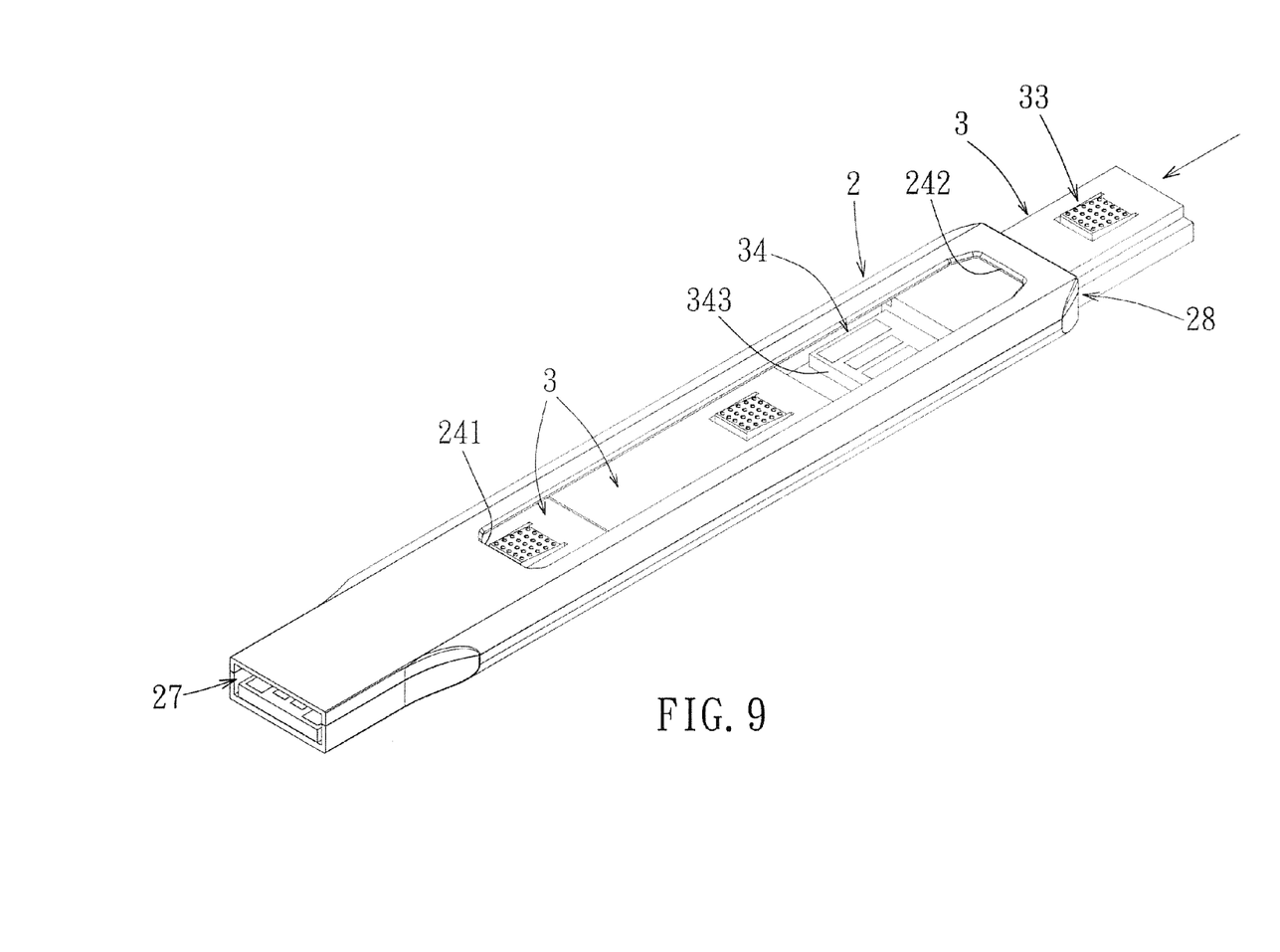
FIG. 9 is another perspective view of the portable memory storage device of FIG. 1, illustrating insertion of the memory modules.

Then, as shown in FIG. 9, the removed memory module 3 (i.e., the first memory module 3) may be reinserted into the housing 2 by aligning the tongue portion 343 of the removed memory module 3 with the rear slot 28, depressing the resilient member 332, and sliding the memory module 3 in the extension direction (A), until the tongue portion 343 abuts against the abutment portions 323 and the retaining wall 325 of the preceding memory module 3 (see FIG. 4) and the positioning mechanism 33 engages the rear opening-defining edge 242. To access a desired one of the memory modules 3, the user only needs to remove and reinsert the memory modules 3 until the desired one of the memory modules 3 is at a position closely adjacent to the front end portion 21 in the housing 2 through the abovementioned steps.

Furthermore, in order to distinguish among the plurality of the memory modules 3, each of the memory modules 3 can be distinctly marked. For example, one of the memory modules 3 used exclusively for storing music files can be marked with a musical note, another one of the memory modules 3 used exclusively for storing image files can be marked with a camera, and yet another one of the memory modules 3 used exclusively for storing video files can be marked with a movie reel. These distinct markings allow the user to easily categorize and conveniently retrieve desired files.

To sum up, the portable memory storage device of the present invention allows the user to access and store information and data according to his/her needs and to rearrange the memory modules 3 within the housing 2 to access a required one of the memory modules 3. By facilitating organization of the files stored in the portable memory storage device, this invention increases the efficiency of finding specific files as required by the user.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A portable memory storage device adapted to be inserted into a port connector of an electronic device, said portable memory storage device comprising:
    a housing defining a receptive space therein, extending in an extension direction, and including
        a front end portion being formed with a front slot in spatial communication with said receptive space,
        a rear end portion being formed with a rear slot in a spatial communication with said receptive space and opposite to said front end portion in the extension direction, and
        a top plate extending from said front end portion to said rear end portion, and being formed with a window opening that extends in the extension direction and that is in spatial communication with said receptive space; and
    a plurality of memory modules insertable into said housing in the extension direction through one of said front slot and said rear slot, each of said memory modules including
        a module shell including a module body and a positioning mechanism disposed at said module body, said module body including a substrate that has an inner surface defining a first accommodating space and an outer surface, said positioning mechanism being disposed on said substrate and including a resilient member that is shiftable between a default state, where said resilient member protrudes from said outer surface of said substrate, and a depressed state, where said resilient member sinks into said substrate toward said inner surface of said substrate; and
        a memory member connected to said module shell and including an insulating case having a main portion that is disposed in said first accommodating space and a tongue portion that is exposed from said module shell, a plurality of pins disposed on said tongue portion and spaced apart from one another, and a memory unit disposed within said insulating case and electrically connected to said pins;
    wherein when a first one of said memory modules is disposed in said receptive space of said housing and is closely adjacent to said front slot of said front end portion, said front end portion of said housing surrounds said tongue portion of said insulating case of said first one of said memory modules to constitute a plug portion that is configured to be inserted into the port connector of the electronic device, and said pins of said first one of said memory modules are configured to be electrically connected to the port connector.

2. The portable memory storage device as claimed in claim 1, wherein said top plate of said housing has front and rear opening-defining edges that are opposite to each other in the extension direction, that define said window opening therebetween, and that are adjacent to said front and rear end portions, respectively;

wherein said memory modules abut against and are aligned with one another in said receptive space of said housing;

wherein said tongue portion of said first one of said memory modules is adjacent to said front slot, and said tongue portion of each remaining one of said memory modules abuts against one of said memory modules that is immediately in front of said remaining one of said memory modules;

wherein said resilient member of said positioning mechanism of said module shell of each of said memory modules is exposed through said window opening, said resilient member of said first one of said memory modules engages and abuts against said front opening-defining edge, and said resilient member of a last one of said memory modules that is closely adjacent to said rear end portion engages and abuts against said rear opening-defining edge, such that said memory modules are positioned in said receptive space of said housing;

wherein, when said resilient member of one of said first and last ones of said memory modules is depressed to the depressed state, said resilient member is disengaged from a corresponding one of said front and rear opening-defining edges and said memory modules are slidable in the extension direction.

3. The portable memory storage device as claimed in claim 2, wherein said resilient member is a resilient tab, said positioning mechanism further includes a connecting portion connecting said resilient member with said substrate of said module body, and said resilient member extends inclinedly and upwardly from said connecting portion with respect to said substrate toward said tongue portion of said insulating case of said memory member.

4. The portable memory storage device as claimed in claim 2, wherein said housing further includes a bottom plate opposite to said top plate, and two side walls extending in the extension direction and being connected between said top plate and said bottom plate at opposite longitudinal sides of said housing parallel to the extension direction, said top and bottom plates and said side walls surrounding said tongue portion of said first one of said memory modules at said front end portion so as to constitute said plug portion.

5. The portable memory storage device as claimed in claim 4, wherein a thickness of a portion of each of said side walls at said front end portion is less than a thickness of a remaining portion of each of said side walls.

6. The portable memory storage device as claimed in claim 1, wherein said resilient member has an outer surface that is exposed from said outer surface of said substrate and that has a plurality of spaced-apart protuberances thereon.

7. The portable memory storage device as claimed in claim 1, wherein said substrate extends in a longitudinal direction, and said module body further includes two lateral walls protruding respectively from opposite sides of said substrate toward said inner surface of said substrate and extending in the longitudinal direction, a partition wall perpendicular to the longitudinal direction and connected between said lateral walls, and a retaining wall spaced apart from said partition wall and protruding from said inner surface of said substrate, wherein said substrate, said lateral walls, and said partition wall cooperate to define said first accommodating space, wherein said substrate, said lateral walls, and said retaining wall cooperate to define a second accommodating space that is opposite to said first accommodating space in the longitudinal direction for accommodating said tongue portion of a succeeding one of said memory modules in said receptive space.

8. The portable memory storage device as claimed in claim 7, wherein said module body further includes a pair of pegs protruding from said inner surface of said substrate in said first accommodating space, and said insulating case of said memory member is formed with a pair of notches engaging said pegs, respectively.

9. The portable memory storage device as claimed in claim 7, wherein each of said lateral walls has an abutment portion that is adjacent to said partition wall, that extends toward said retaining wall, and that is adapted to abut against said tongue portion of said succeeding one of said memory modules.

10. The portable memory storage device as claimed in claim 7, wherein each of said lateral walls is depressed to form a shoulder portion on a connection edge with said substrate, said shoulder portion being spaced apart from said top plate of said housing when said memory module is disposed in said housing.

11. The portable memory storage device as claimed in claim 7, wherein said tongue portion of each remaining one of said memory modules, excluding said first one of said memory modules, is received in said second accommodating space of one of said memory modules that is immediately in front of said remaining one of said memory modules.

12. The portable memory storage device as claimed in claim 7, wherein said positioning mechanism is integrally connected to said substrate, and said substrate is formed with a substrate opening, in which said positioning mechanism is disposed, and an allowance space adjacent to said second accommodating space and in spatial communication with said substrate opening for accommodating said resilient member in the depressed state.

* * * * *